US010863656B2

(12) United States Patent
Otsubo

(10) Patent No.: US 10,863,656 B2
(45) Date of Patent: Dec. 8, 2020

(54) RADIO-FREQUENCY MODULE

(71) Applicant: Murata Manufacturing Co., Ltd., Kyoto (JP)

(72) Inventor: Yoshihito Otsubo, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 9 days.

(21) Appl. No.: 16/414,896

(22) Filed: May 17, 2019

(65) Prior Publication Data

US 2019/0273312 A1    Sep. 5, 2019

Related U.S. Application Data

(63) Continuation of application No. PCT/JP2017/042968, filed on Nov. 30, 2017.

(30) Foreign Application Priority Data

Dec. 2, 2016  (JP) ................. 2016-235269

(51) Int. Cl.
*H05K 7/00* (2006.01)
*H05K 9/00* (2006.01)
(Continued)

(52) U.S. Cl.
CPC ............ *H05K 9/00* (2013.01); *H01L 23/00* (2013.01); *H01L 23/28* (2013.01); *H01Q 1/38* (2013.01);
(Continued)

(58) Field of Classification Search
CPC ............ H01Q 1/422; H01Q 1/38; H01Q 1/40; H01Q 23/00; H05K 9/00; H01L 23/28; H01L 23/00
See application file for complete search history.

(56) References Cited

U.S. PATENT DOCUMENTS

2013/0020119 A1   1/2013 Yoshida
2013/0155639 A1   6/2013 Ogawa et al.
(Continued)

FOREIGN PATENT DOCUMENTS

EP   0996155 A2   4/2000
JP   H0458596 A   2/1992
(Continued)

OTHER PUBLICATIONS

International Search Report for International Application No. PCT/JP2017/042968.
(Continued)

*Primary Examiner* — Dieu Hien T Duong
(74) *Attorney, Agent, or Firm* — Pearne & Gordon LLP

(57) ABSTRACT

A radio-frequency module includes a multilayer circuit board, components mounted on a top surface of the multilayer circuit board, a first sealing resin layer sealing the components, a plurality of components mounted on a bottom surface of the multilayer circuit board, a second sealing resin layer sealing the components, a shield electrode disposed on a bottom surface of the second sealing resin layer in a region that overlaps a predetermined component, a shield wall disposed between the predetermined component and another component, part of the shield wall being exposed from the bottom surface of the second sealing resin layer and connected to the shield electrode, and a shield film covering a top surface and side surface of the first sealing resin layer and a side surface of the multilayer circuit board.

7 Claims, 7 Drawing Sheets

(51) Int. Cl.
  *H01Q 1/38*  (2006.01)
  *H01Q 1/40*  (2006.01)
  *H01Q 1/42*  (2006.01)
  *H01Q 23/00* (2006.01)
  *H01L 23/28* (2006.01)
  *H01L 23/00* (2006.01)

(52) U.S. Cl.
  CPC ............... *H01Q 1/40* (2013.01); *H01Q 1/422* (2013.01); *H01Q 23/00* (2013.01)

(56) References Cited

U.S. PATENT DOCUMENTS

2015/0131231 A1   5/2015  Yoo et al.
2016/0035678 A1   2/2016  Yoo et al.

FOREIGN PATENT DOCUMENTS

| | | | |
|---|---|---|---|
| JP | 2000-133765 A | | 5/2000 |
| JP | 2011124366 A * | 6/2011 | ............. H01L 24/97 |
| JP | 2013-26330 A | | 2/2013 |
| KR | 10-2015-0053579 A | | 5/2015 |
| KR | 10-2016-0014913 A | | 2/2016 |
| WO | 2012/023332 A1 | | 2/2012 |

OTHER PUBLICATIONS

Written Opinion for International Application No. PCT/JP2017/042968.

* cited by examiner

FIG. 10
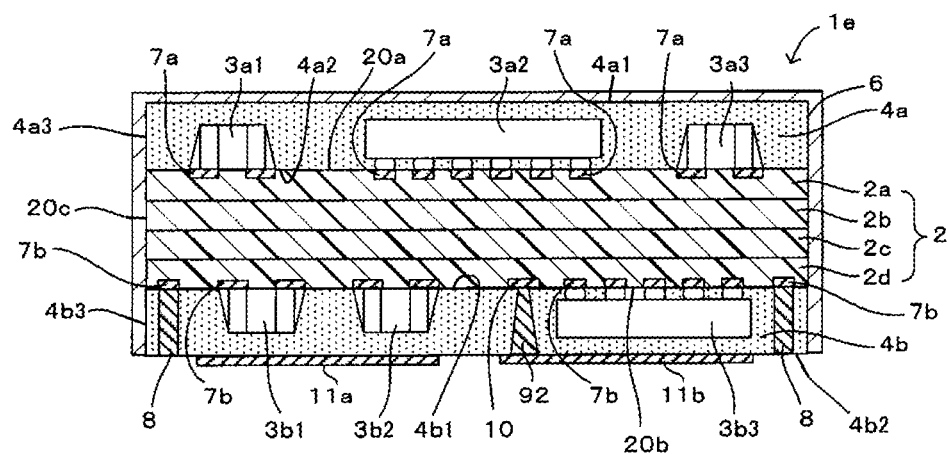
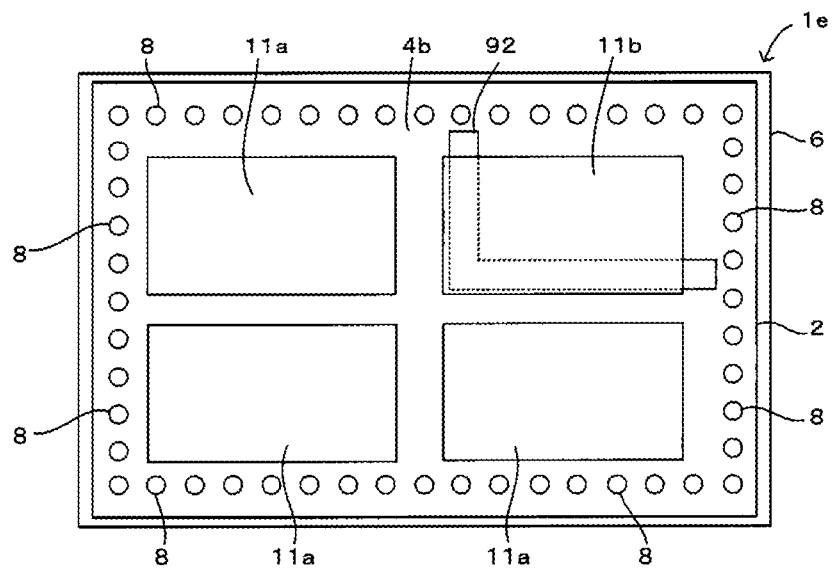
FIG. 11A
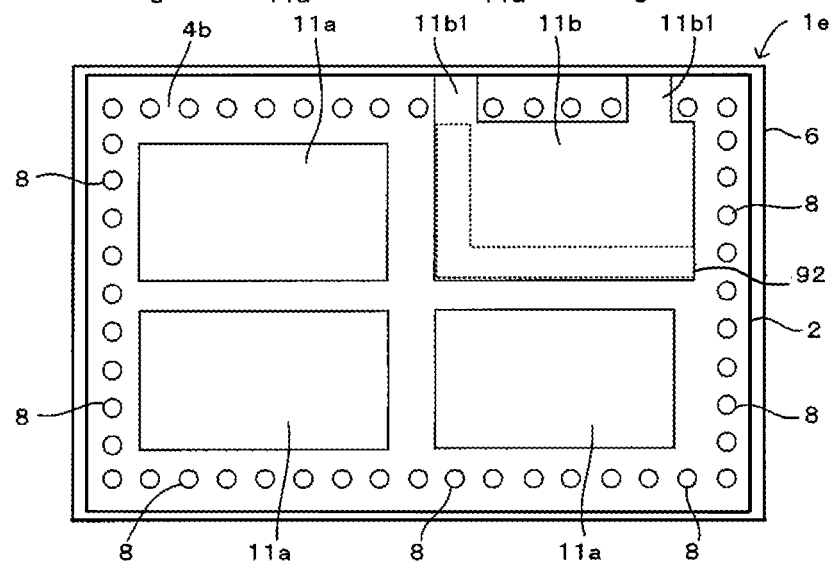
FIG. 11B

RADIO-FREQUENCY MODULE

This is a continuation of International Application No. PCT/JP2017/042968 filed on Nov. 30, 2017 which claims priority from Japanese Patent Application No. 2016-235269 filed on Dec. 2, 2016. The contents of these applications are incorporated herein by reference in their entireties.

BACKGROUND OF THE DISCLOSURE

Field of the Disclosure

The present disclosure relates to a radio-frequency module including a shield.

Description of the Related Art

In some radio-frequency modules that are mounted on mobile terminal devices or other devices, components mounted on one main surface of a circuit board are sealed by resin, and the surface of the sealing resin is covered with a shield film. In addition, at a request for high-density packaging in recent years, in some radio-frequency modules, components are mounted on both main surfaces of a circuit board, and are similarly covered with a shield film. For example, as shown in FIG. 13, in a radio-frequency module 100 described in Patent Document 1, a plurality of components 102 is mounted on each of a top surface 101a and bottom surface 101b of a circuit board 101, and each set of components 102 is sealed by a corresponding one of sealing resin layers 103a, 103b. The surface of the sealing resin layer 103a on the top surface side and the side surface of the circuit board 101 are covered with a shield film 104. Columnar conductors 105 for connection to an external device are provided in the sealing resin layer 103b on the bottom surface side of the circuit board 101, and the columnar conductors 105 are connected to a mother board or another device provided outside.

Patent Document 1: International Publication No. 2012/023332 (see paragraphs 0020 to 0026, FIG. 4, and the like)

BRIEF SUMMARY OF THE DISCLOSURE

However, in the above-described existing radio-frequency module 100, the sealing resin layer 103b on the bottom surface 101b side of the circuit board 101 is not covered with the shield film 104. Therefore, the components 102 mounted on the bottom surface 101b of the circuit board 101 are not sufficiently shielded. Particularly, for the components 102 that are easily affected by the noise coming from the outside, a technique for sufficiently shielding not only the components 102 mounted on the top surface 101a of the circuit board 101 but also the components 102 mounted on the bottom surface 101b is needed.

The present disclosure is made in view of the above-described inconvenience, and it is an object of the present disclosure to provide a radio-frequency module in which a component is mounted on each of main surfaces of a circuit board and that is able to shield not only the component mounted on one of the main surfaces of the circuit board but also the component mounted on the other one of the main surfaces.

To achieve the above object, a radio-frequency module of the present disclosure includes a circuit board, a plurality of first components, a first sealing resin layer, a plurality of second components, a second sealing resin layer, a shield electrode, a shield member, and a shield film. The plurality of first components is mounted on one of main surfaces of the circuit board. The first sealing resin layer seals the one of the main surfaces of the circuit board and the plurality of first components. The plurality of second components is mounted on the other one of the main surfaces of the circuit board. The second sealing resin layer seals the other one of the main surfaces of the circuit board and the plurality of second components. The shield electrode covers the second sealing resin layer. The shield member provided on the other one of the main surfaces is disposed in the second sealing resin layer between a predetermined second component and another second component, which are among the plurality of second components. The first sealing resin layer has a contact surface, a facing surface, and a side surface. The contact surface contacts with the one of the main surfaces of the circuit board. The facing surface faces the contact surface. The side surface connects edges of the contact surface and the facing surface. The second sealing resin layer has a contact surface, a facing surface, and a side surface. The contact surface contacts with the other one of the main surfaces of the circuit board. The facing surface faces the contact surface. The side surface connects edges of the contact surface and the facing surface. The shield film covers the facing surface of the first sealing resin layer, the side surface of the first sealing resin layer, the side surface of the second sealing resin layer, and a side surface of the circuit board. The shield electrode covers a portion of the facing surface of the second sealing resin layer. The portion overlaps with the predetermined second component among the plurality of second components when viewed in a direction perpendicular to the other one of the main surfaces of the circuit board. Part of the shield member provided on the other one of the main surfaces is exposed from the facing surface of the second sealing resin layer and connected to the shield electrode. The predetermined second component is surrounded by the shield film, the shield member provided on the other one of the main surfaces, and the shield electrode.

With this configuration, the plurality of first components mounted on the one of the main surfaces of the circuit board is surrounded by the shield film, so a sufficient shielding effect is obtained. Of the plurality of second components mounted on the other one of the main surfaces of the circuit board, the predetermined second component has a portion that overlaps with the shield electrode when viewed from the other one of the main surfaces of the circuit board. Therefore, the shield electrode and the shield member provide a shielding effect for the predetermined second component against the noise coming from the side toward the other one of the main surfaces of the circuit board. The shield member provided on the other one of the main surfaces is disposed between the predetermined second component and the other second component, so the mutual noise interference between the predetermined second component and the other second component is prevented.

Part of an edge of the shield electrode may contact with a portion of the shield film, covering the side surface of the second sealing resin layer.

With this configuration, the shield film, the shield electrode, and the shield member provided on the other one of the main surfaces are electrically continuous. Therefore, when the shield electrode is connected to an external ground electrode of, for example, a mother board or the like, the shield electrode, the shield film, and the shield member provided on the other one of the main surfaces are grounded without using wires of the circuit board.

The radio-frequency module may further include a shield member provided on the one of the main surfaces and disposed in the first sealing resin layer between a predetermined first component and another first component, which are among the plurality of first components, part of the shield member being exposed from a surface of the first sealing resin layer and connected to the shield film. The shield member provided on the one of the main surfaces and the shield member provided on the other one of the main surfaces may be connected to each other by a connection conductor provided on or in the circuit board.

With this configuration, the predetermined first component and the predetermined second component are surrounded by the shield electrode, the shield member provided on the one of the main surfaces, the shield member provided on the other one of the main surfaces, the shield film, and the connection conductor. Therefore, the shielding characteristics of the predetermined first component and the predetermined second component are improved.

The radio-frequency module may further include a plurality of external connection terminals, one end of each of which is connected to an electrode formed on the other one of the main surfaces of the circuit board and the other end of each of which is exposed from a surface of the second sealing resin layer. The plurality of external connection terminals may be arranged around the predetermined second component such that the predetermined second component is surrounded by the shield member provided on the other one of the main surfaces and the plurality of external connection terminals when viewed in the direction perpendicular to the other one of the main surfaces of the circuit board.

With this configuration, the plurality of external connection terminals functions as a part of a shield surrounding the predetermined second component. Therefore, in comparison with the case where the predetermined second component is surrounded by only the shield member provided on the other one of the main surfaces, a mounting area on the other one of the main surfaces of the circuit board is reduced.

According to the present disclosure, the plurality of first components mounted on the one of the main surfaces of the circuit board is surrounded by the shield film, so a sufficient shielding effect is obtained. Of the plurality of second components mounted on the other one of the main surfaces of the circuit board, the predetermined second component has a portion that overlaps with the shield electrode when viewed from the other one of the main surfaces of the circuit board. Therefore, the shield electrode and the shield member provide a shielding effect for the predetermined second component against the noise coming from the side toward the other one of the main surfaces of the circuit board. The shield member provided on the other one of the main surfaces is disposed between the predetermined second component and the other second component. Therefore, the mutual noise interference between the predetermined second component and the other second component is prevented.

Figure 8:
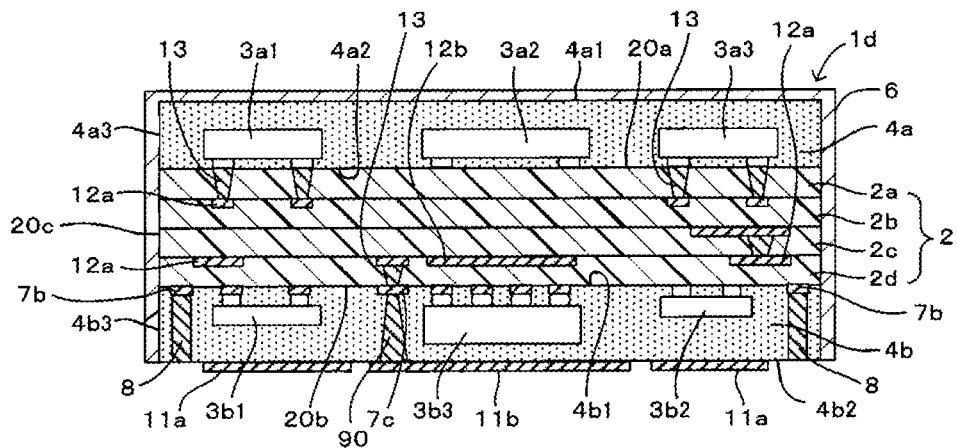
FIG. 8 is a cross-sectional view of a radio-frequency module according to a fourth embodiment of the present disclosure.
Figure 9A:
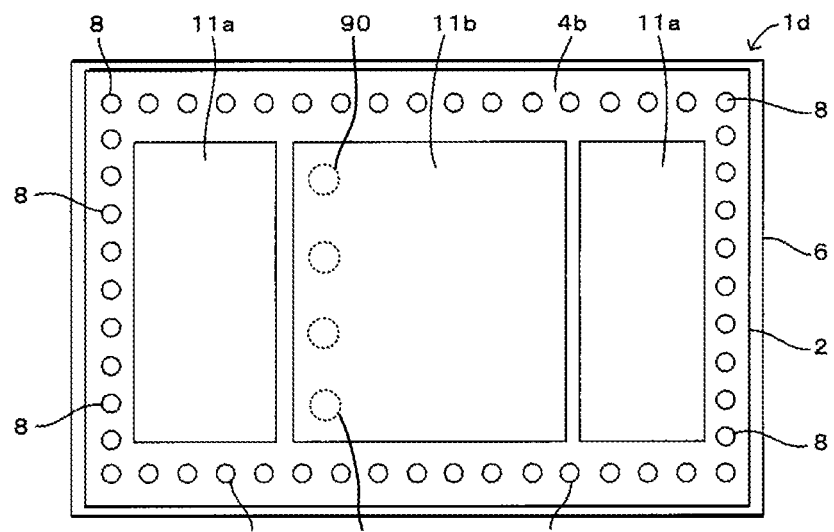
Figure 9B:
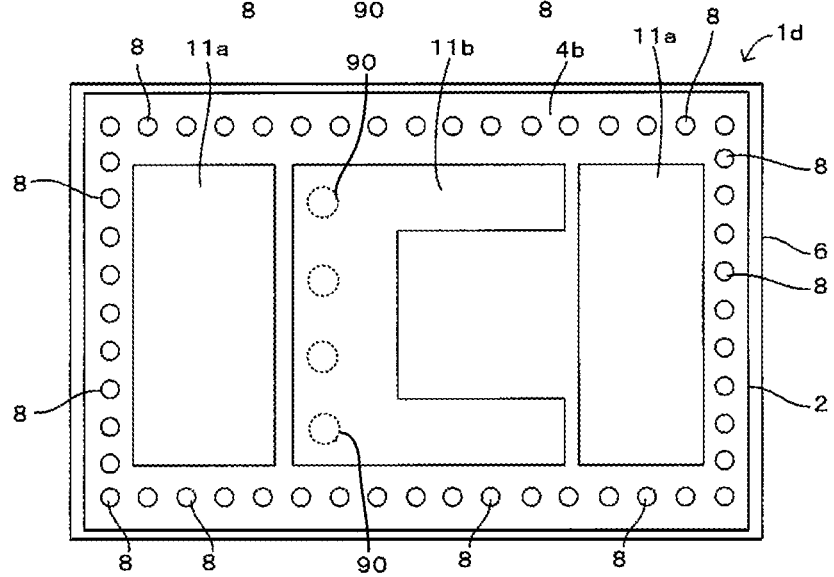

Each of FIGS. 9A and 9B is a bottom view of the radio-frequency module of FIG. 8.

FIG. 10 is a cross-sectional view of a radio-frequency module according to a fifth embodiment of the present disclosure.

Each of FIGS. 11A and 11B is a bottom view of the radio-frequency module of FIG. 10.

Figure 12:
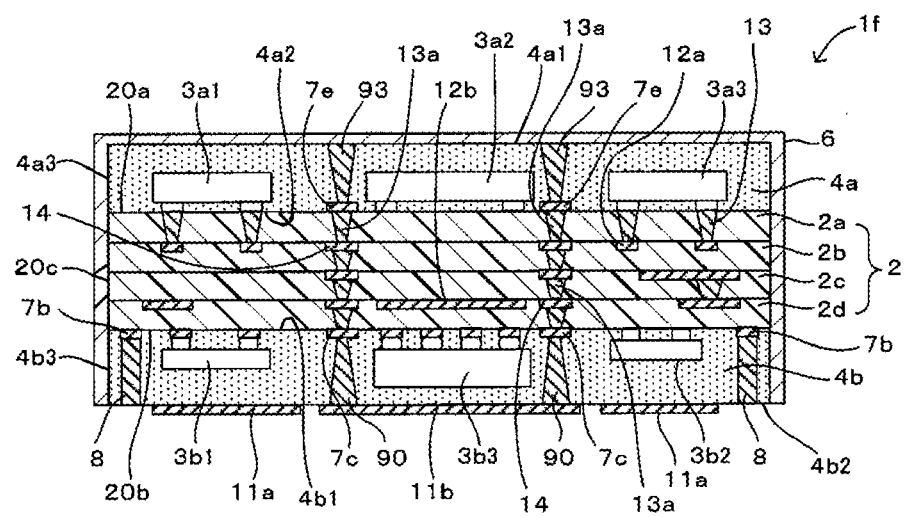

FIG. 12 is a cross-sectional view of a radio-frequency module according to a sixth embodiment of the present disclosure.

Figure 13:
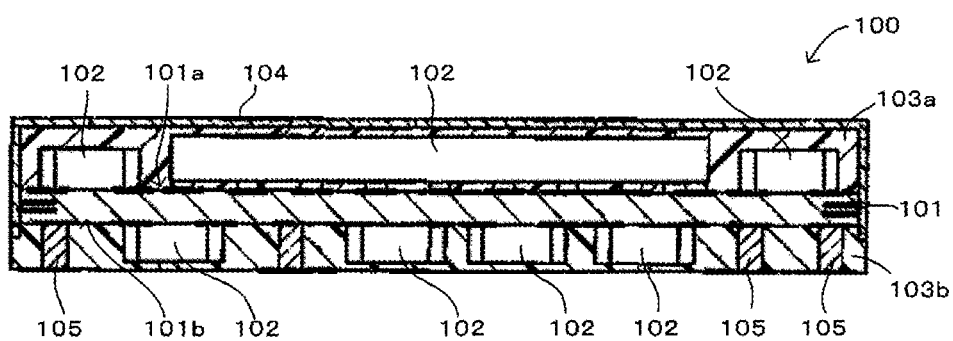

FIG. 13 is a cross-sectional view of an existing radio-frequency module.

DETAILED DESCRIPTION OF THE DISCLOSURE

First Embodiment

Figure 1:
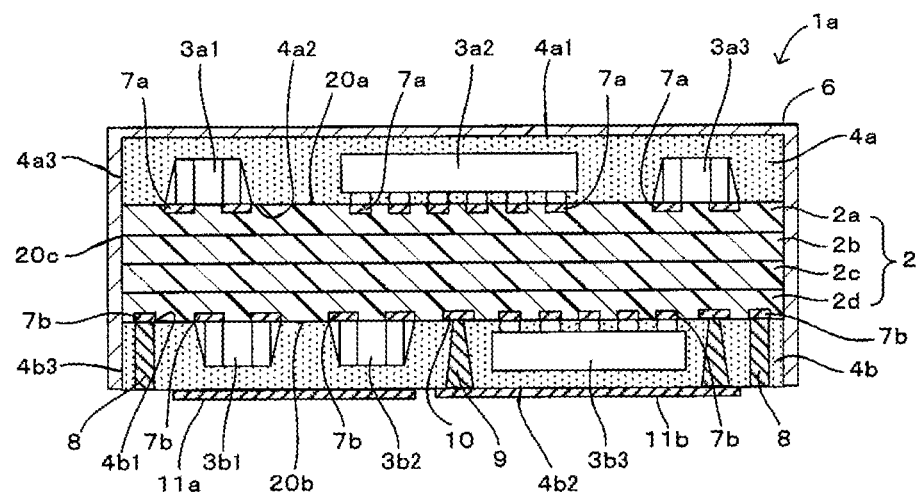
FIG. 1 is a cross-sectional view of a radio-frequency module according to a first embodiment of the present disclosure.
Figure 2:
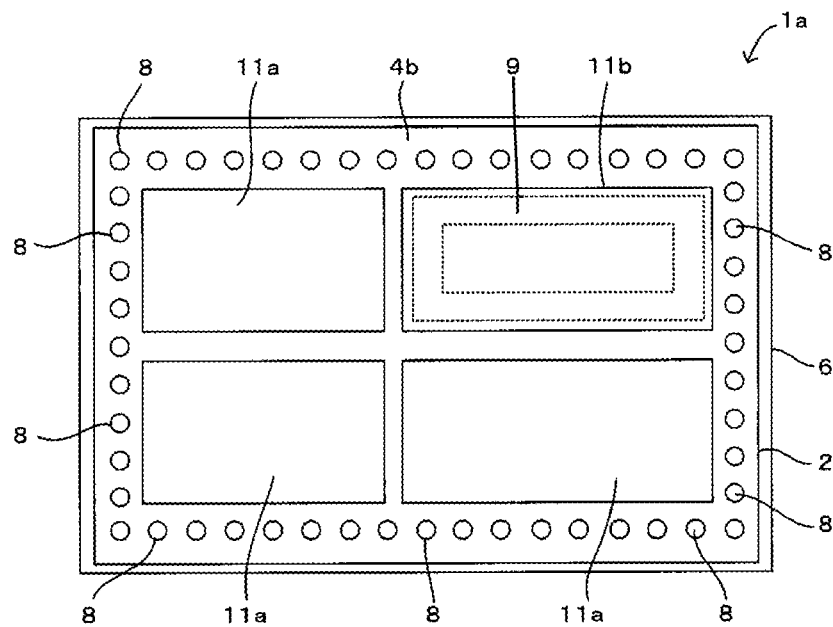
FIG. 2 is a bottom view of the radio-frequency module of FIG. 1.

A radio-frequency module 1a according to a first embodiment of the present disclosure will be described with reference to FIG. 1 and FIG. 2. FIG. 1 is a cross-sectional view of the radio-frequency module. FIG. 2 is a bottom view of the radio-frequency module 1a.

As shown in FIG. 1 and FIG. 2, the radio-frequency module 1a according to this embodiment includes a multilayer circuit board 2 (which corresponds to a circuit board of the present disclosure), a plurality of components 3a1 to 3a3 (which correspond to first components of the present disclosure), a first sealing resin layer 4a, a plurality of components 3b1 to 3b3 (which correspond to second components of the present disclosure), a second sealing resin layer 4b, and a shield film 6. The plurality of components 3a1 to 3a3 are mounted on a top surface 20a of the multilayer circuit board 2. The first sealing resin layer 4a is laminated on the top surface 20a of the multilayer circuit board 2. The plurality of components 3b1 to 3b3 are mounted on a bottom surface 20b of the multilayer circuit board 2. The second sealing resin layer 4b is laminated on the bottom surface 20b of the multilayer circuit board 2. The radio-frequency module 1a is mounted on, for example, a mother board, or the like, of electronic equipment that uses a radio-frequency signal.

The multilayer circuit board 2 is made up of, for example, a plurality of laminated electrically insulating layers 2a to 2d made of low-temperature cofired ceramics, glass epoxy resin, or the like. Mounting electrodes 7a for mounting components are formed on the top surface 20a (which corresponds to one of main surfaces of the circuit board of the present disclosure) of the multilayer circuit board 2. Mounting electrodes 7b and a surface layer electrode 10 are formed on the bottom surface 20b (which corresponds to the other one of the main surfaces of the circuit board of the present disclosure) of the multilayer circuit board 2. The mounting electrodes 7b are used to mount the components 3b1 to 3b3 and external connection terminals 8. A shield wall 9 is disposed on the surface layer electrode 10. The surface layer electrode 10 is formed in substantially the same shape (annular shape) as the shield wall 9 at a location that overlaps with the shield wall 9 when viewed in a direction perpendicular to the bottom surface 20b of the multilayer circuit board 2. Various internal wiring electrodes (not shown) are formed in each of the adjoining electrically insulating layers 2a to 2d. Via conductors (not shown) for connecting the internal wiring electrodes formed in the different electrically insulating layers 2a to 2d are formed in the multilayer circuit board 2.

The mounting electrodes 7a, 7b, the surface layer electrode 10, and the internal wiring electrodes each are made of a metal that is generally used as a wiring electrode, such as Cu, Ag, and Al. The via conductors in the multilayer circuit board 2 are made of a metal, such as Ag and Cu. Ni/Au plating may be applied to each of the mounting electrodes 7a, 7b.

The components 3a1 to 3a3, 3b1 to 3b3 are semiconductor components made from semiconductors, such as Si and GaAs, or chip components, such as a chip inductor, a chip capacitor, and a chip resistor. The set of components 3a1 to 3a3 and the set of components 3b1 to 3b3 are respectively mounted on the top surface 20a and bottom surface 20b of the multilayer circuit board 2 by a general surface mount technique, such as solder bonding. In this embodiment, of the plurality of components 3b1 to 3b3 mounted on the bottom surface 20b of the multilayer circuit board 2, the component 3b3 (which corresponds to a predetermined second component of the present disclosure) surrounded by the shield wall 9 and a shield electrode 11b is a semiconductor element which may cause a malfunction, such as misoperation, under the effect of noise.

The first sealing resin layer 4a is laminated on the top surface 20a of the multilayer circuit board 2 so as to cover the top surface 20a of the multilayer circuit board 2 and the components 3a1 to 3a3 mounted on the top surface 20a. The second sealing resin layer 4b is laminated on the bottom surface 20b of the multilayer circuit board 2 so as to cover the bottom surface 20b of the multilayer circuit board 2 and the components 3b1 to 3b3 mounted on the bottom surface 20b. The first sealing resin layer 4a has a top surface 4a1, a bottom surface 4a2 facing the top surface 4a1, and a side surface 4a3 connecting the edges of the top surface 4a1 and bottom surface 4a2. The bottom surface 4a2 contacts with the top surface 20a of the multilayer circuit board 2. The second sealing resin layer 4b has a top surface 4b1, a bottom surface 4b2 facing the top surface 4b1, and a side surface 4b3 connecting the edges of the top surface 4b1 and bottom surface 4b2. The top surface 4b1 contacts with the bottom surface 20b of the multilayer circuit board 2. In this embodiment, an aggregate in which a plurality of the radio-frequency modules 1a on which no shield film 6 has been formed yet is arranged in a matrix is formed, and then the aggregate is singulated by, for example, cutting the aggregate with a dicing machine. Therefore, a side surface 20c of the multilayer circuit board 2, the side surface 4a3 of the first sealing resin layer 4a, and the side surface 4b3 of the second sealing resin layer 4b are disposed in substantially the same plane. The first and second sealing resin layers 4a, 4b each may be made of a resin that is generally used as a sealing resin, such as epoxy resin.

As shown in FIG. 2, the shield wall 9 (which corresponds to a shield member provided on the other one of the main surfaces of the present disclosure) disposed in the second sealing resin layer 4b is formed into a shape having a rectangular outline and surrounding the component 3b3 when viewed in a direction perpendicular to the bottom surface 20b of the multilayer circuit board 2. Of the plurality of components 3b1 to 3b3 mounted on the bottom surface 20b of the multilayer circuit board 2, the component 3b3 that is a semiconductor element is disposed in the region surrounded by the shield wall 9, with the result that the mutual noise interference between the component 3b3 and the other components 3b1, 3b2 is prevented. The upper end portion of the shield wall 9 is connected to the surface layer electrode 10 formed on the bottom surface 20b of the multilayer circuit board 2. The lower end portion of the shield wall 9 is exposed from the bottom surface 4b2 of the second sealing resin layer 4b and connected to a shield electrode 11b (described later). The shield wall 9 can be formed by, for example, forming an annular groove in the second sealing resin layer 4b with the use of laser beam, or the like, and then filling the groove with electrically conductive paste, or using sputtering, or another method.

A plurality of the external connection terminals 8 is provided. Each external connection terminal 8 is upright on the bottom surface 20b of the multilayer circuit board 2 such that one end is connected to the mounting electrode 7b at the bottom surface 20b of the multilayer circuit board 2 and the other end is exposed from the bottom surface 4b2 of the second sealing resin layer 4b. Each external connection terminal 8 is connected to the mounting electrode 7b by solder or another method. As shown in FIG. 2, the external connection terminals 8 are arranged along the periphery of the bottom surface 20b of the multilayer circuit board 2 having a rectangular shape when viewed in a direction perpendicular to the bottom surface 20b of the multilayer circuit board 2. Each external connection terminal 8 is formed by, for example, shearing a wire made of a metal material that is generally used as a wiring electrode, such as Cu, Au, Ag, Al, and a Cu-based alloy. In this embodiment, each external connection terminal 8 is formed in a circular columnar shape with substantially the same width and length.

A plurality of shield electrodes 11a and the shield electrode 11b are formed on the bottom surface 4b2 of the second sealing resin layer 4b. As shown in FIG. 2, the shield electrodes 11a, 11b of this embodiment each are formed in a horizontally-oriented rectangular shape and arranged in a matrix of two by two within the region surrounded by the external connection terminals 8. Of the plurality of shield electrodes 11a, 11b, the predetermined shield electrode 11b is disposed at a location that overlaps with the component 3b3 that is a semiconductor element when viewed in a direction perpendicular to the bottom surface 20b of the multilayer circuit board 2. The shield electrode 11b is formed so as to be greater in area than the component 3b3. When viewed in a direction perpendicular to the bottom surface 20b of the multilayer circuit board 2, the shield electrode 11b is disposed such that the component 3b3 is included in the shield electrode 11b. The shield electrode 11b is connected to the lower end portion of the shield wall 9 exposed from the bottom surface 4b2 of the second sealing resin layer 4b. In this case, the component 3b3 is surrounded by the bottom surface 20b of the multilayer circuit board 2, the shield wall 9, and the shield electrode 11b. The shield electrodes 11a, 11b each are made of a metal that is generally used as a wiring electrode, such as Cu, Ag, and Al. The shield electrodes 11a, 11b are connected to ground electrodes of a mother board outside by solder or another method. In this embodiment, the shield electrode 11b is provided only to shield the component 3b3; however, the other shield electrodes 11a may be floating electrodes not connected to wiring electrodes formed on or in the multilayer circuit board 2 or may be electrodes that are connected to wiring electrodes formed on or in the multilayer circuit board 2. When the shield electrodes 11a are connected to wiring electrodes, the shield electrodes 11a have both functions of a shield and an electrode for connection to a device outside.

The shield film 6 is provided to shield the internal wiring electrodes in the multilayer circuit board 2 and the components 3a1 to 3a3, 3b1 to 3b3 against the noise coming from the outside. The shield film 6 covers the top surface 4a1 and side surface 4a3 of the first sealing resin layer 4a, the side surface 20c of the multilayer circuit board 2, and the side surface 4b3 of the second sealing resin layer 4b. The shield film 6 is connected to the internal wiring electrode (ground electrode) exposed from the side surface 20c of the multilayer circuit board 2.

The shield film 6 may have a multilayer structure having an adhesion film, an electrically conductive film, and a protective film. The adhesion film is laminated on the first and second sealing resin layers 4a, 4b and the multilayer circuit board 2. The electrically conductive film is laminated on the adhesion film. The protective film is laminated on the electrically conductive film.

The adhesion film is provided to enhance the strength of the adhesion between the electrically conductive film and each of the first sealing resin layer 4a and the second sealing resin layer 4b. The adhesion film may be made of, for example, a metal such as SUS. The electrically conductive film is a layer that is in charge of a substantial shielding function of the shield film 6. The electrically conductive film may be made of, for example, a metal that is any one of Cu, Ag, and Al. The protective film is provided to prevent the corrosion or damage to the electrically conductive film. The protective film may be made of, for example, SUS.

Therefore, with the above-described embodiment, the shield film 6 is able to shield the plurality of components 3a1 to 3a3 mounted on the top surface 20a of the multilayer circuit board 2 against the noise coming from the sides toward the top surface 4a1 and side surface 4a3 of the first sealing resin layer 4a. In addition, the shield electrodes 11a, 11b formed on the bottom surface 4b2 of the second sealing resin layer 4b are able to shield the plurality of components 3a1 to 3a3 against the noise coming from the side toward the bottom surface 20b of the multilayer circuit board 2. Thus, a sufficient shielding effect is obtained against the noise coming from any direction. In addition, the shield film 6 and the shield electrodes 11a, 11b also provide a sufficient shielding effect for the plurality of components 3b1 to 3b3 mounted on the bottom surface 20b of the multilayer circuit board 2. Particularly, the component 3b3 that is one of the plurality of components 3b1 to 3b3 mounted on the bottom surface 20b of the multilayer circuit board 2 is surrounded by the shield electrode 11b and the shield wall 9. Therefore, not only the shielding performance against the noise coming from the side toward the bottom surface 4b2 of the second sealing resin layer 4b is further improved, but also the mutual noise interference between the component 3b3 and each of the other components 3b1, 3b2 is prevented.

The plurality of external connection terminals 8 are arranged so as to surround the components 3b1 to 3b3 mounted on the bottom surface 20b of the multilayer circuit board 2. Therefore, a shielding effect is also provided by the external connection terminals 8. It is preferable that the spacing of the external connection terminals 8 in this case be less than or equal to ½λ (wave length) of the frequency of possible noise. With such a disposition, a shielding effect provided by the external connection terminals 8 is improved.

A shield resistance is reduced by connecting the large-area shield electrodes 11a, 11b to the ground electrodes of a mother board, so the shielding performance is improved. The shield electrodes 11a, 11b may be used as lands for heat radiation.

Second Embodiment

Figure 3:
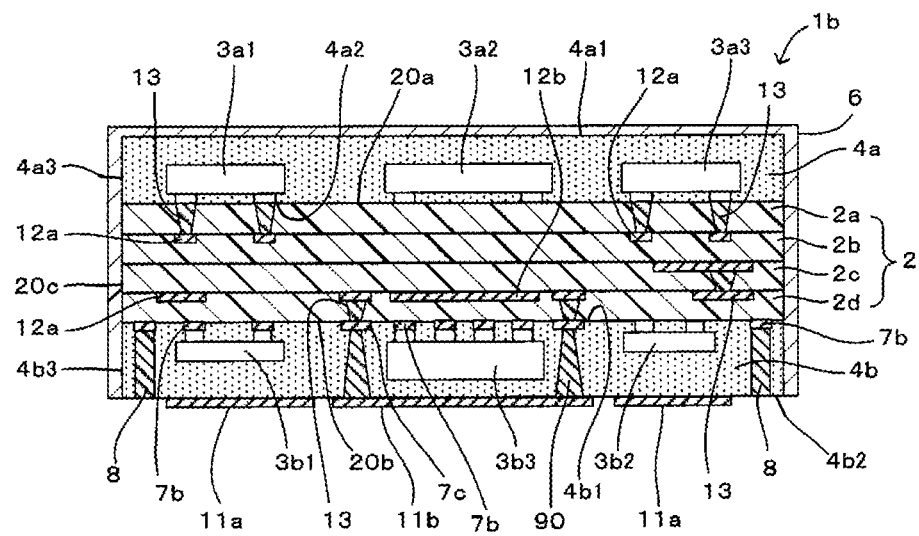
FIG. 3 is a cross-sectional view of a radio-frequency module according to a second embodiment of the present disclosure.
Figure 4:
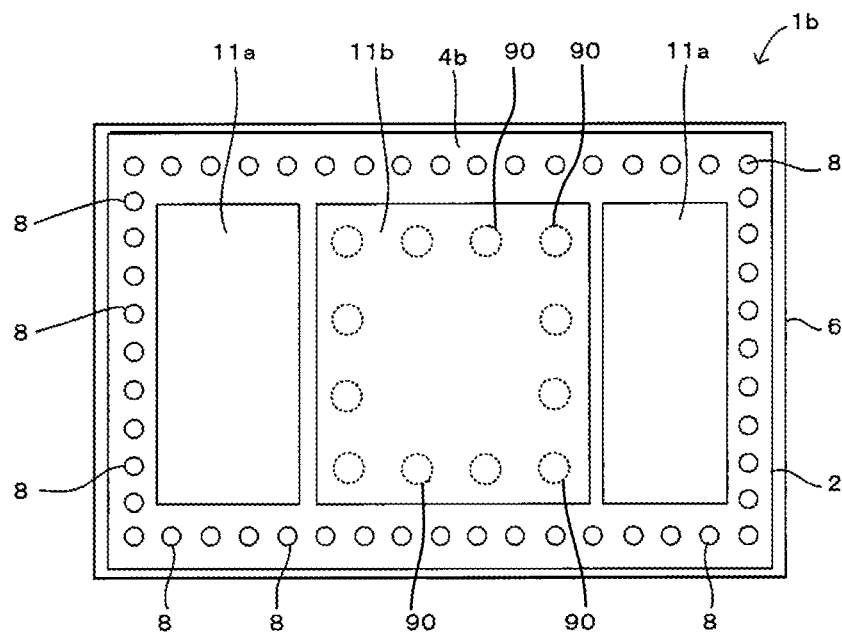
FIG. 4 is a bottom view of the radio-frequency module of FIG. 3.

A radio-frequency module 1b according to a second embodiment of the present disclosure will be described with reference to FIG. 3 and FIG. 4. FIG. 3 is a cross-sectional view of the radio-frequency module 1b. FIG. 4 is a bottom view of the radio-frequency module 1b.

The radio-frequency module 1b according to this embodiment differs from the radio-frequency module 1a of the first embodiment, described with reference to FIG. 1 and FIG. 2, in that, as shown in FIG. 3 and FIG. 4, the arrangement of the components 3b1 to 3b3 mounted on the bottom surface 20b of the multilayer circuit board 2 is different, the configuration of a shield that surrounds the predetermined component 3b3 is different, and a part of internal wiring electrodes 12a, 12b and via conductors 13 formed in the multilayer circuit board 2 are shown. The remaining configuration is the same as that of the radio-frequency module 1a of the first embodiment, so like reference signs are assigned, and the description thereof is omitted.

In this case, of the components 3b1 to 3b3 mounted on the bottom surface 20b of the multilayer circuit board 2, the component 3b3 that is a semiconductor element is mounted at the center portion of the bottom surface 20b of the multilayer circuit board 2, and the other components 3b1, 3b2 are disposed so as to interpose the component 3b3 therebetween. When viewed in a direction perpendicular to the bottom surface 20b of the multilayer circuit board 2, the shield electrodes 11a, 11b are disposed so as to overlap with the components 3b1 to 3b3. At this time, as shown in FIG. 4, the shield electrode 11b disposed at the location that overlaps with the component 3b3 that is a semiconductor element is formed in substantially a square shape, and the two shield electrodes 11a disposed at the locations that respectively overlap with the remaining components 3b1, 3b2 each are formed in a vertically-oriented rectangular shape. In this embodiment, the shield electrode 11b is provided only to shield the component 3b3; however, the other shield electrodes 11a may be floating electrodes that are not connected to wiring electrodes formed on or in the multilayer circuit board 2 or may be electrodes that are connected to wiring electrodes formed on or in the multilayer circuit board 2. When the shield electrodes 11a are connected to wiring electrodes, the shield electrodes 11a have both functions of a shield and an electrode for connection to a device outside.

A plurality of via conductors 90 (which correspond to the shield member provided on the other one of the main surfaces of the present disclosure) are provided instead of the shield wall 9 of the first embodiment as a shield member between the components. When viewed in a direction perpendicular to the bottom surface 20b of the multilayer circuit board 2, these via conductors 90 are arranged inside the periphery of the shield electrode 11b at the predetermined spacing along the line made by the periphery. At this time, the component 3b3 is surrounded by the via conductors 90, so the via conductors 90 function as a shield between the components. Each via conductor 90 may be formed by, for example, forming a via hole extending through in a thickness direction of the second sealing resin layer 4b by laser beam machining such that a surface layer electrode 7c is exposed and then filling the via hole with electrically conductive paste, applying via fill plating, or another method. In this embodiment, the surface layer electrode 7c is provided individually for each via conductor 90. Instead, the surface layer electrode 7c may be formed in an annular shape like the surface layer electrode 10 of the first embodiment. It is preferable that the predetermined spacing of the via conductors 90 be less than or equal to ¼λ (wave length) of the frequency of possible noise. With such a disposition, a shielding effect provided by the via conductors 90 is improved. The internal wiring electrodes 12a, 12b include the one disposed at the location that overlaps with the component 3b3 when viewed in a direction perpendicular to the bottom surface 20b of the multilayer circuit board 2, and the internal wiring electrode 12b is grounded, so the internal wiring electrode 12b functions as a shield for the component 3b3. As for the arrangement of the via conductors 90, the via conductors 90 may be arranged without any spacing such that any adjacent two via conductors 90 contact with each other. Of the plurality of via conductors 90 shown in FIG. 4, not only the four via conductors 90 disposed between the center component 3b3 and the left component 3b1 and the four via conductors 90 disposed between the center component 3b3 and the right component 3b2, but also the remaining via conductors 90 not disposed between the components make up a part of the shield member provided on the other one of the main surfaces of the present disclosure.

With this configuration that the shield wall 9 of the first embodiment is replaced by the plurality of via conductors 90, similar advantageous effects to those of the radio-frequency module 1a of the first embodiment are obtained.

(Alternative Embodiment of Shield Electrode)

Figure 5A:
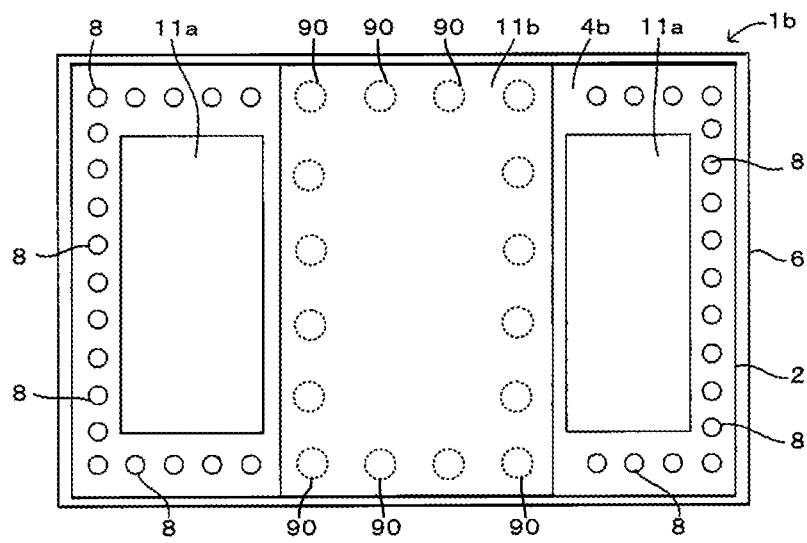
FIGS. 5A, 5B and 5C show alternative embodiments of a shield electrode of FIG. 3.
Figure 5B:
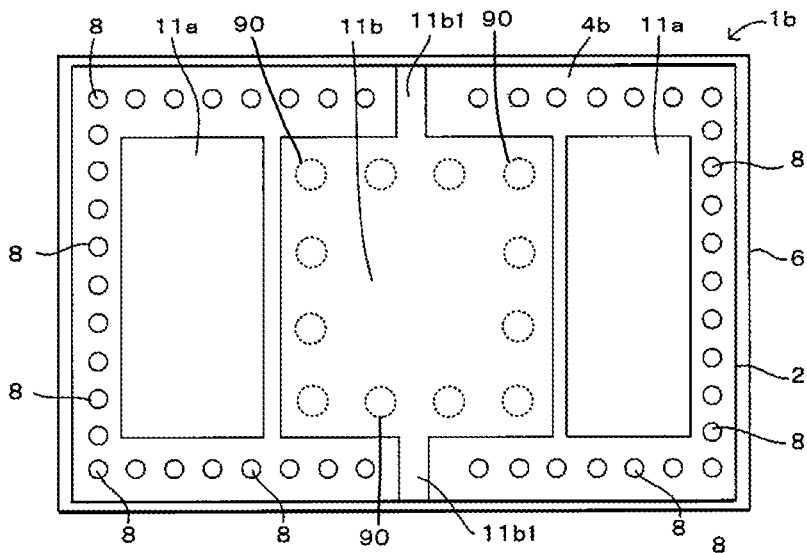
Figure 5C:
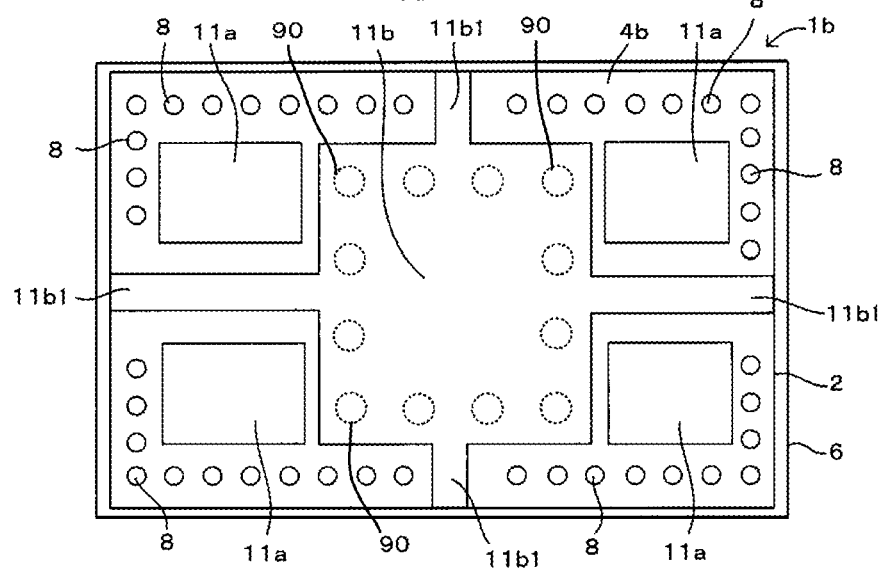

The shape of the shield electrode 11b for the component 3b3 that is a semiconductor element is not limited to the above-described shape, and may be changed as needed. For example, as shown in FIG. 5A, the shield electrode 11b may be formed in a vertically-oriented rectangular shape, and two short sides may reach the edge of the second sealing resin layer 4b when viewed in a direction perpendicular to the bottom surface 20b of the multilayer circuit board 2. Alternatively, as shown in FIG. 5B, an extended portion 11b1 extending to the edge of the bottom surface 4b2 of the second sealing resin layer 4b may be provided at each of two opposite sides of the shield electrode 11b. Alternatively, as shown in FIG. 5C, the extended portion 11b1 extending to the edge of the bottom surface 4b2 of the second sealing resin layer 4b may be provided at each of four sides of the shield electrode 11b. In the case of any one of FIG. 5A to FIG. 5C as well, a part of the edge of the shield electrode 11b contacts with a portion of the shield film 6, covering the side surface 4b3 of the second sealing resin layer 4b, to make the electrical continuity therebetween. Therefore, without using the internal wiring electrodes in the multilayer circuit board 2, grounding of the shield film 6 and the via conductors 90 is possible.

Third Embodiment

Figure 6:
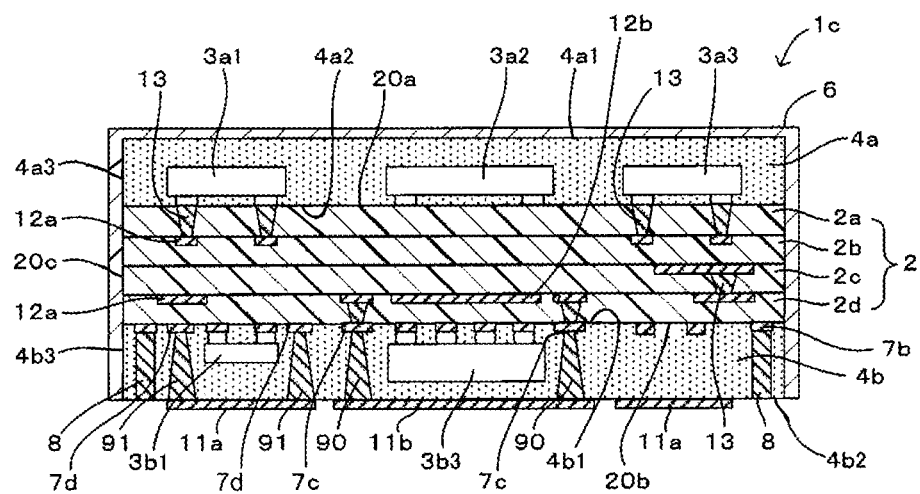
FIG. 6 is a cross-sectional view of a radio-frequency module according to a third embodiment of the present disclosure.
Figure 7:
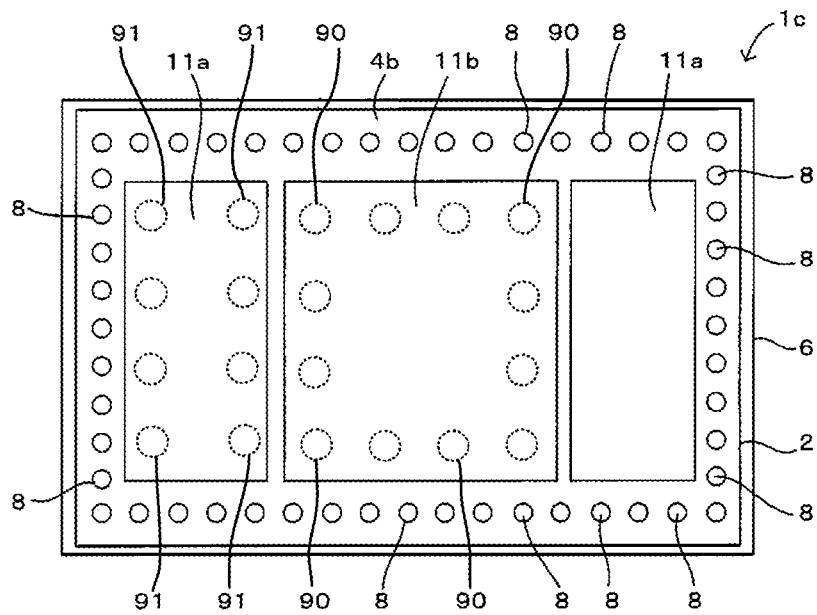
FIG. 7 is a bottom view of the radio-frequency module of FIG. 6.

A radio-frequency module 1c according to a third embodiment of the present disclosure will be described with reference to FIG. 6 and FIG. 7. FIG. 6 is a cross-sectional view of the radio-frequency module 1c. FIG. 7 is a bottom view of the radio-frequency module 1c.

The radio-frequency module 1c according to this embodiment differs from the radio-frequency module 1b of the second embodiment, described with reference to FIG. 3 and FIG. 4, in that, as shown in FIG. 6 and FIG. 7, the configuration of the components 3b1 to 3b3 mounted on the bottom surface 20b of the multilayer circuit board 2 is different and the configuration of a shield provided at the second sealing resin layer 4b side is different. The remaining configuration is the same as that of the radio-frequency module 1b of the second embodiment, so like reference signs are assigned, and the description thereof is omitted.

In this case, the disposition and shapes of the shield electrodes 11a, 11b formed on the bottom surface 4b2 of the second sealing resin layer 4b are the same as those of the second embodiment; however, one component (the component 3b2 of the second embodiment) is not mounted. In addition, as shown in FIG. 7, the remaining component 3b1 different from the center component 3b3 surrounded by the via conductors 90 is also surrounded by via conductors 91 of the same type as the via conductors 90 for the component 3b3. Each of the via conductors 91 is provided on a surface layer electrode 7d, one end of each via conductor 91 is connected to the surface layer electrode 7d, and the other end of the via conductor 91 is connected to the shield electrode 11a. In this embodiment, the shield electrode 11b is provided only to shield the component 3b3 and, of the other shield electrodes 11a, the shield electrode 11a that surrounds the component 3b1 is provided only to shield the component 3b1; however, the remaining shield electrode 11a may be a floating electrode that is not connected to a wiring electrode formed on or in the multilayer circuit board 2 or may be an electrode that is connected to a wiring electrode formed on or in the multilayer circuit board 2. When the shield electrodes 11a are connected to wiring electrodes, the shield electrodes 11a have both functions of a shield and an electrode for connection to a device outside.

With this configuration, all the components 3b1, 3b3 mounted on the bottom surface 20b of the multilayer circuit board 2 are surrounded by the shield electrodes 11a, 11b and the plurality of via conductors 90, 91. Therefore, in addition to the advantageous effects obtained in the second embodiment, the effect of preventing the mutual noise interference between the components 3b1, 3b3 is further improved, and the shielding characteristics of the component 3b1 is further improved.

Fourth Embodiment

A radio-frequency module 1d according to a fourth embodiment of the present disclosure will be described with reference to FIG. 8, and FIGS. 9A and 9B. FIG. 8 is a cross-sectional view of the radio-frequency module 1d. Each of FIGS. 9A and 9B is a bottom view of the radio-frequency module 1d.

The radio-frequency module 1d according to this embodiment differs from the radio-frequency module 1b of the second embodiment, described with reference to FIG. 3 and FIG. 4, in that, as shown in FIG. 8, and FIGS. 9A and 9B, the configuration of a shield provided at the second sealing resin layer 4b side is different. The remaining configuration is the same as that of the radio-frequency module 1b of the second embodiment, so like reference signs are assigned, and the description thereof is omitted.

In this case, the plurality of via conductors 90 is not arranged to surround the center component 3b3 like the second embodiment but arranged only between the components 3b1, 3b3. That is, as shown in FIG. 9A, of four sides of the shield electrode 11b, the via conductors 90 are arranged along one side disposed between the components 3b1, 3b3.

With this configuration, the space for disposing the via conductors 90 is reduced, so the flexibility of design of wiring pattern and component mounting on the bottom surface 20b of the multilayer circuit board 2 is improved. This configuration is suitable for a shield structure when the mutual noise interference between the component 3b2 and the component 3b3 does not matter. In this case, the shape of the shield electrode 11b may be changed as needed. For example, as shown in FIG. 9B, a part of a region in which no via conductor 90 is disposed may be cut out. In this embodiment, the shield electrode 11b is provided only to shield the component 3b3; however, the other shield electrodes 11a may be floating electrodes that are not connected to wiring electrodes formed on or in the multilayer circuit board 2 or may be electrodes that are connected to wiring electrodes formed on or in the multilayer circuit board 2. When the shield electrodes 11a are connected to wiring electrodes, the shield electrodes 11a have both functions of a shield and an electrode for connection to a device outside.

Fifth Embodiment

A radio-frequency module 1e according to a fifth embodiment of the present disclosure will be described with reference to FIG. 10, and FIGS. 11A and 11B. FIG. 10 is a cross-sectional view of the radio-frequency module 1e. Each of FIGS. 11A and 11B is a bottom view of the radio-frequency module 1e.

The radio-frequency module 1e according to this embodiment differs from the radio-frequency module 1a of the first embodiment, described with reference to FIG. 1 and FIG. 2, in that, as shown in FIG. 10, and FIGS. 11A and 11B, the configuration of a shield between the components, which is provided in the second sealing resin layer 4b, is different. The remaining configuration is the same as that of the radio-frequency module 1a of the first embodiment, so like reference signs are assigned, and the description thereof is omitted.

In this case, as shown in FIG. 11A, a shield wall 92 (which corresponds to the shield member provided on the other one of the main surfaces of the present disclosure) is formed in an L-shape along a set of short side and long side of the horizontally-oriented rectangular shield electrode 11b when viewed in a direction perpendicular to the bottom surface 20b of the multilayer circuit board 2. The shield wall 92 and a part of the plurality of external connection terminals 8 arranged at the peripheral portion of the bottom surface 20b of the multilayer circuit board 2 surround the component 3b3. That is, a part of the plurality of external connection terminals 8 arranged at the peripheral portion of the bottom surface 20b of the multilayer circuit board 2 is used as a shield surrounding the component 3b3.

With this configuration, a part of the external connection terminals 8 are used as a part of a shield surrounding the component 3b3. Therefore, the flexibility of design of wiring pattern and component mounting on the bottom surface 20b of the multilayer circuit board 2 is improved. The shape of the shield electrode 11b may be changed as needed. For example, as shown in FIG. 11B, an extended portion 11b1 extending to the edge of the bottom surface 4b2 of the second sealing resin layer 4b may be provided in the shield electrode 11b. With this configuration, a part of the edge of the shield electrode 11b contacts with a portion of the shield film 6, covering the side surface 4b3 of the second sealing resin layer 4b, to make the electrical continuity therebetween. Therefore, without using the internal wiring electrodes in the multilayer circuit board 2, grounding of the shield film 6 and the shield wall 92 is possible. In this embodiment, the shield electrode 11b is provided only to shield the component 3b3; however, the other shield electrodes 11a may be floating electrodes that are not connected to wiring electrodes formed on or in the multilayer circuit board 2 or may be electrodes that are connected to wiring electrodes formed on or in the multilayer circuit board 2. When the shield electrodes 11a are connected to wiring electrodes, the shield electrodes 11a have both functions of a shield and an electrode for connection to a device outside.

Sixth Embodiment

A radio-frequency module 1f according to a sixth embodiment of the present disclosure will be described with reference to FIG. 12. FIG. 12 is a cross-sectional view of the radio-frequency module 1f.

The radio-frequency module 1f according to this embodiment differs from the radio-frequency module 1b of the second embodiment, described with reference to FIG. 3 and FIG. 4, in that, as shown in FIG. 12, the configuration of a shield is different. The remaining configuration is the same as that of the radio-frequency module 1b of the second embodiment, so like reference signs are assigned, and the description thereof is omitted.

In this case, a shield is provided between the components, that is, a shield is provided for the component 3a2 (which corresponds to the predetermined first component of the present disclosure) mounted at the center of the top surface 20a of the multilayer circuit board 2 as well as the component 3b3 mounted at the center of the bottom surface 20b of the multilayer circuit board 2. This shield between the components is made up of a plurality of via conductors 93 (which correspond to a shield member provided on one of the main surfaces of the present disclosure) extending through the first sealing resin layer 4a in the thickness direction. The via conductors 93 are arranged so as to surround the component 3a2 when viewed in a direction perpendicular to the top surface 20a of the multilayer circuit board 2 as well as the via conductors 90 at the second sealing resin layer 4b side. Each via conductor 93 is disposed on a surface layer electrode 7e formed on the top surface 20a of the multilayer circuit board 2. One end of each via conductor 93 is exposed from the top surface 4a1 of the first sealing resin layer 4a and connected to the shield film 6, and the other end of the via conductor 93 is connected to the surface layer electrode 7e.

In this embodiment, the via conductors 93 are provided in the same number as the via conductors 90 disposed at the second sealing resin layer 4b side, and each are disposed at the location that overlaps with the via conductor 90 disposed at the second sealing resin layer 4b side to make a pair when viewed in a direction perpendicular to the top surface 20a of the multilayer circuit board 2. The surface layer electrodes 7c, 7e of each paired via conductors 90, 93 are connected via a plurality of via conductors 13a and a plurality of pad electrodes 14. The plurality of via conductors 13a and the plurality of pad electrodes 14 are formed in the multilayer circuit board 2. The plurality of via conductors 13a and the plurality of pad electrodes 14 that connect each pair of via conductors 90, 93 are alternately disposed in the thickness direction of the multilayer circuit board 2. When viewed in a direction perpendicular to the top surface 20a of the multilayer circuit board 2, the pair of the via conductor 93 at the first sealing resin layer 4a side and the via conductor 90 at the second sealing resin layer 4b side, the surface layer electrodes 7c, 7e that are connected to these via conductors 93, 90, and the plurality of via conductors 13a and the plurality of pad electrodes 14 that connect both the surface layer electrodes 7c, 7e are overlapped with each other and are linearly connected.

The pair of via conductors 90, 93 do not always need to be linearly connected. The pair of via conductors 90, 93 just need to be connected via the plurality of via conductors 13a and the plurality of pad electrodes 14 formed in the multi-layer circuit board 2. Without providing the pad electrodes 14, the via conductors 13a that are adjacent in the thickness direction of the multilayer circuit board 2 may be directly connected to one another. The set of the plurality of via conductors 13a and the plurality of pad electrodes 14 that connect the pair of via conductors 90, 93 correspond to a connection conductor of the present disclosure.

With this configuration, closed regions are formed by the shield film 6, the shield (the via conductors 93) between the components on one of the main surfaces, the connection conductor (the via conductors 13a and the pad electrodes 14), the shield (the via conductors 90) between the components on the other one of the main surfaces, and the shield electrode 11b, and the component 3a2 and the component 3b3 are respectively disposed in the regions. Therefore, the shielding performance for both components 3a2, 3b3 is further improved.

The present disclosure is not limited to the above-described embodiments. Various modifications other than the above-described ones may be made without departing from the purport of the present disclosure. For example, some of the configurations of the above-described embodiments and alternative embodiments may be combined.

The number of electrically insulating layers and wiring layers that make up the multilayer circuit board 2 may be changed as needed.

The configuration that the shield film 6 does not cover the side surface 4b3 of the second sealing resin layer 4b is also applicable. In this case, the external connection terminals 8 should be used as a shield for the portion of the shield film 6, covering the side surface 4b3 of the second sealing resin layer 4b.

The present disclosure is applicable to various radio-frequency modules including a sealing resin layer that covers components mounted on a circuit board, a shield that covers the surface of the sealing resin layer, and a shield that prevents the mutual noise interference between the components.

1a to 1f radio-frequency module
2 multilayer circuit board (circuit board)
3a1 to 3a3 component (first component)
3b1 to 3b3 component (second component)
4a first sealing resin layer
4b second sealing resin layer
6 shield film
8 external connection terminal
9, 92 shield wall (shield member provided on the other one of main surfaces)
13a via conductor (connection conductor)
14 pad electrode (connection conductor)
90, 91 via conductor (shield member provided on the other one of the main surfaces)
93 via conductor (shield member provided on one of the main surfaces)

The invention claimed is:

1. A radio-frequency module comprising:
    a circuit board;
    a plurality of first components mounted on one of main surfaces of the circuit board;
    a first sealing resin layer sealing the one of the main surfaces of the circuit board and the plurality of first components;
    a plurality of second components mounted on another one of the main surfaces of the circuit board;
    a second sealing resin layer sealing the other one of the main surfaces of the circuit board and the plurality of second components;
    a shield electrode covering the second sealing resin layer;
    a first shield member provided on the other one of the main surfaces and disposed in the second sealing resin layer between a predetermined second component and another second component, among the plurality of second components; and
    a shield film, wherein
    the first sealing resin layer has a first contact surface, a first facing surface, and a first side surface, the first contact surface contacts with the one of the main surfaces of the circuit board, the first facing surface faces the first contact surface, and the first side surface connects edges of the first contact surface and the first facing surface,
    the second sealing resin layer has a second contact surface, a second facing surface, and a second side surface, the second contact surface contacts with the other one of the main surfaces of the circuit board, the second facing surface faces the second contact surface, and the second side surface connects edges of the second contact surface and the second facing surface,
    the shield film covers the first facing surface, the first side surface, the second side surface, and a side surface of the circuit board,
    the shield electrode covers a portion of the second facing surface overlapping with the predetermined second component among the plurality of second components when viewed in a direction perpendicular to the other one of the main surfaces of the circuit board,
    a part of the first shield member is exposed from the second facing surface and connected to the shield electrode, and
    the predetermined second component is surrounded by the shield film, the first shield member, and the shield electrode.

2. The radio-frequency module according to claim 1, wherein a part of an edge of the shield electrode contacts with a portion of the shield film covering the second side surface.

3. The radio-frequency module according to claim 2, further comprising
    a second shield member provided on the one of the main surfaces and disposed in the first sealing resin layer between a predetermined first component and another first component among the plurality of first components, a part of the second shield member being exposed from a surface of the first sealing resin layer and connected to the shield film, wherein
    the second shield member and the first shield member are connected to each other by a connection conductor provided on or in the circuit board.

4. The radio-frequency module according to claim 2, further comprising
    a plurality of external connection terminals, wherein one end of each of the plurality of external connection terminals is connected to an electrode provided on the other one of the main surfaces of the circuit board, and the other end of each of the plurality of external connection terminals is exposed from a surface of the second sealing resin layer, wherein the plurality of external connection terminals are arranged around the predetermined second component such that the predetermined second component is surrounded by the first shield member and the plurality of external connection terminals when viewed in the direction perpendicular to the other one of the main surfaces of the circuit board.

5. The radio-frequency module according to claim 1, further comprising a second shield member provided on the one of the main surfaces and disposed in the first sealing resin layer between a predetermined first component and another first component among the plurality of first components, a part of the second shield member being exposed from a surface of the first sealing resin layer and connected to the shield film, wherein the second shield member and the first shield member are connected to each other by a connection conductor provided on or in the circuit board.

6. The radio-frequency module according to claim 5, further comprising a plurality of external connection terminals, wherein one end of each of the plurality of external connection terminals is connected to an electrode provided on the other one of the main surfaces of the circuit board, and the other end of each of the plurality of external connection terminals is exposed from a surface of the second sealing resin layer, wherein the plurality of external connection terminals are arranged around the predetermined second component such that the predetermined second component is surrounded by the first shield member and the plurality of external connection terminals when viewed in the direction perpendicular to the other one of the main surfaces of the circuit board.

7. The radio-frequency module according to claim 1, further comprising a plurality of external connection terminals, wherein one end of each of the plurality of external connection terminals is connected to an electrode provided on the other one of the main surfaces of the circuit board, and the other end of each of the plurality of external connection terminals is exposed from a surface of the second sealing resin layer, wherein the plurality of external connection terminals are arranged around the predetermined second component such that the predetermined second component is surrounded by the first shield member and the plurality of external connection terminals when viewed in the direction perpendicular to the other one of the main surfaces of the circuit board.

\* \* \* \* \*